(12) United States Patent
Eo et al.

(10) Patent No.: US 10,381,496 B2
(45) Date of Patent: Aug. 13, 2019

(54) SOLAR CELL IN STACK STRUCTURE HAVING NO STEP

(71) Applicant: Hyundai Motor Company, Seoul (KR)

(72) Inventors: Moon Jung Eo, Suwon-si (KR); Eun Yeong Lee, Seoul (KR); Sang Hak Kim, Seoul (KR); Mi Yeon Song, Seoul (KR)

(73) Assignee: Hyundai Motor Company, Seoul (KR)

( * ) Notice: Subject to any disclaimer, the term of this patent is extended or adjusted under 35 U.S.C. 154(b) by 69 days.

(21) Appl. No.: 15/287,558

(22) Filed: Oct. 6, 2016

(65) Prior Publication Data

US 2017/0271534 A1 Sep. 21, 2017

(30) Foreign Application Priority Data

Mar. 16, 2016 (KR) .................. 10-2016-0031376

(51) Int. Cl.
*H01L 31/02* (2006.01)
*H01L 31/05* (2014.01)
*H01L 31/048* (2014.01)
*H01L 31/0216* (2014.01)
*H01L 31/0224* (2006.01)

(52) U.S. Cl.
CPC ............. *H01L 31/022425* (2013.01); *H01L 31/02008* (2013.01); *H01L 31/02167* (2013.01); *H01L 31/0488* (2013.01); *H01L 31/0512* (2013.01); *H01L 31/0516* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 5,149,351 A | 9/1992 | Yaba et al. | |
| 2006/0162770 A1* | 7/2006 | Matsui | H01G 9/2031 136/263 |
| 2012/0085383 A1 | 4/2012 | Cho et al. | |
| 2012/0097218 A1 | 4/2012 | Vandal et al. | |
| 2013/0160825 A1 | 6/2013 | Lantzer et al. | |
| 2014/0190545 A1 | 7/2014 | Lei et al. | |
| 2017/0179320 A1* | 6/2017 | Erben | H01L 31/0465 |

FOREIGN PATENT DOCUMENTS

| | | |
|---|---|---|
| JP | 2006-332451 A | 12/2006 |
| JP | 2013-143529 A | 7/2013 |
| KR | 10-2010-0071764 A | 6/2010 |
| KR | 10-2011-0007448 A | 1/2011 |
| KR | 10-2012-0007385 A | 1/2012 |
| KR | 10-2013-0069986 A | 6/2013 |

* cited by examiner

*Primary Examiner* — Shannon M Gardner
(74) *Attorney, Agent, or Firm* — Morgan, Lewis & Bockius LLP

(57) ABSTRACT

A solar cell in a stack structure having no step may include a solar cell, and an electrode formed on one surface of the solar cell, in which the solar cell is/are stacked on a center portion of a substrate with the electrode interposed therebetween, and the electrode is/are in contact with an electrode line coated on an edge portion of the substrate.

7 Claims, 3 Drawing Sheets

FIG. 1A
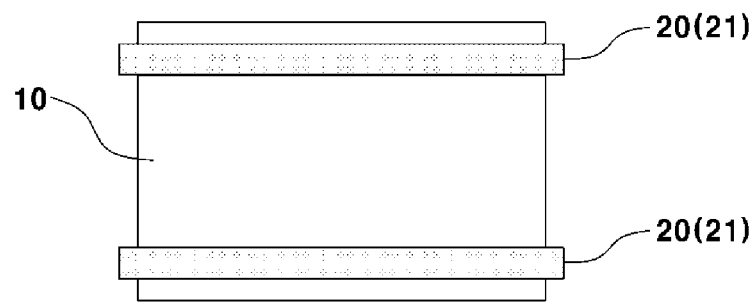
FIG. 1B
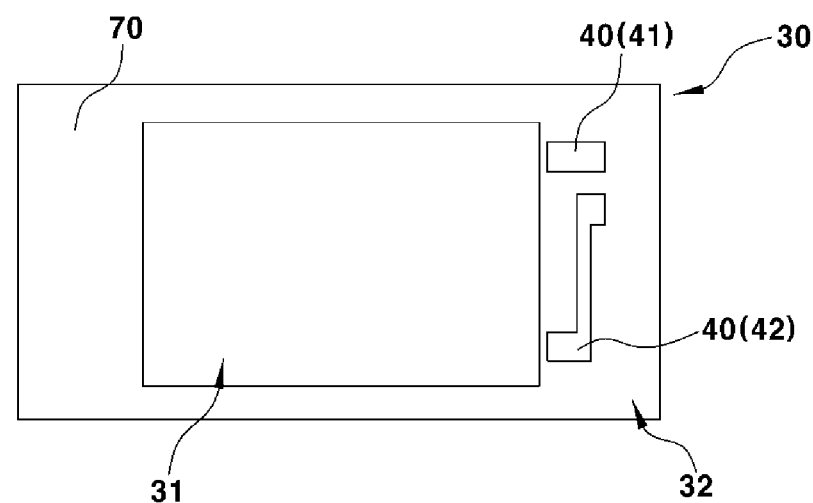
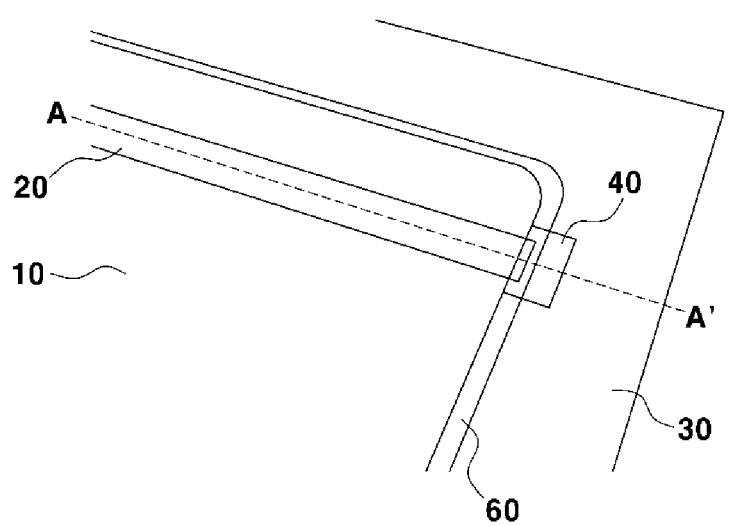
FIG. 2

SOLAR CELL IN STACK STRUCTURE HAVING NO STEP

CROSS-REFERENCE TO RELATED APPLICATION

The present application claims priority to Korean Patent Application No. 10-2016-0031376, filed Mar. 16, 2016, the entire contents of which is incorporated herein for all purposes by this reference.

BACKGROUND OF THE INVENTION

Field of the Invention

The present invention relates to a solar cell having no step between respective elements by changing a connection structure of an electrode and a wire member to be different from that of the related art.

Description of Related Art

Recently, environmentally-friendly vehicles, such as hybrid vehicles, electric vehicles, and fuel cell vehicles, have been rapidly developed. Together with the development of the environmentally-friendly vehicle, research to apply a solar cell to the environmentally-friendly vehicle is also actively underway.

However, in order to apply the solar cell to an actual vehicle, there are still many problems to be solved. For example, there is an issue in how to connect the solar cell and a wire member, such as an electric wire.

As the wire member, an electric wire, such as a copper conductive wire, of which a cross-section is mainly round, is widely used. In the meantime, the solar cell has a structure, in which elements, such as a solar cell and a substrate, having plane shapes are stacked. Accordingly, when an electrode of the solar cell is connected with the wire member and then the wire member is mounted in a vehicle, a stack structure of the solar cell may have a step by a thickness or a three-dimensional effect of the wire member.

When the stack structure of the solar cell has a step, there may be problems such as the disconnection of the wire member according to a movement of the vehicle, or the separation of each element of the stack structure.

In the related art, research on a method of improving efficiency by changing a connection relation between internal elements of a solar cell has mainly been conducted. However, it is obvious that the aforementioned related art cannot solve the problems.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a connection structure of an electrode and a wire member, by which a stack structure of a solar cell does not have a step.

According to various aspects of the present invention, a solar cell in a stack structure having no step may include a solar cell, and an electrode formed on one surface of the solar cell, in which the solar cell may be stacked on a center portion of a substrate with the electrode interposed therebetween, and the electrode may be in contact with an electrode line coated on an edge portion of the substrate.

The electrode may be formed on the one surface of the solar cell in an attachment film and protrude from both sides of the solar cell, one protruding end of the electrode may be in contact with a first end of the electrode line, and a second end of the electrode line may be connected with a wire member.

The electrode may include a positive electrode, and a negative electrode spaced apart from the positive electrode by a predetermined distance, and the electrode line may include a positive electrode line that is in contact with one end of the positive electrode and a negative electrode line that is in contact with one end of the negative electrode.

The electrode line may be a conductive paste coated on the substrate.

The conductive paste may be a metal paste including a silver (Ag) paste, an aluminum (Al) paste, and a copper (Cu) paste, or a mixture of the metal paste and polyurethane or silicon oxide.

The solar cell may further include a finishing member stacked on the solar cell with an area covering the solar cell and a part of the electrode line.

The solar cell may further include an adhesive member interposed between the solar cell and the substrate.

The solar cell may further include a ceramic line coated on the edge portion of the substrate, in which the electrode line may be coated on the ceramic line.

The electrode line may include a coating member, which is formed on the substrate and is in contact with the electrode, and a connection member, which protrudes from the coating member at a predetermined angle and is connected with a wire member.

A plurality of the solar cells may be stacked on the substrate, and a plurality of the electrode lines, which is in contact with the electrodes formed in the plurality of the solar cells, may be coated on the substrate.

According to various embodiments of the present invention, the electrode and the wire member are connected through the electrode line, so that a step is not generated in the stack structure of the solar cell.

Accordingly, when the solar cell according to various embodiments of the present invention is mounted in a vehicle and the like, a problem, such as a short-circuit of the wire member and a separation phenomenon of the stack structure, is not generated.

It is understood that the term "vehicle" or "vehicular" or other similar terms as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuel derived from resources other than petroleum). As referred to herein, a hybrid vehicle is a vehicle that has two or more sources of power, for example, both gasoline-powered and electric-powered vehicles.

The methods and apparatuses of the present invention have other features and advantages which will be apparent from or are set forth in more detail in the accompanying drawings, which are incorporated herein, and the following Detailed Description, which together serve to explain certain principles of the present invention.

BRIEF DESCRIPTION OF THE DRAWINGS

FIG. 1A and FIG. 1B are images illustrating a configuration of a solar cell according to various embodiments of the present invention, and FIG. 1A illustrates a solar cell and an electrode, and FIG. 1B illustrates a substrate and an electrode line.

FIG. 2 is an enlarged image illustrating a connection structure of the electrode and the electrode line of the solar cell according to various embodiments of the present invention.

FIG. 5A illustrates a solar cell and an electrode and FIG. 5B illustrates a substrate and an electrode line.

Figure 3:
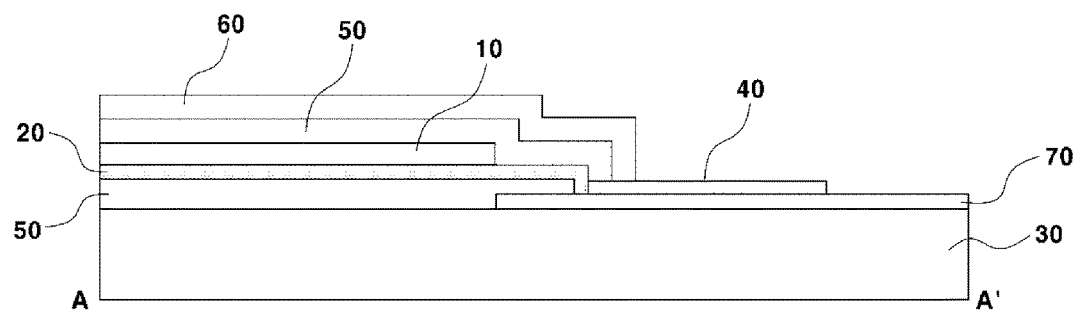
FIG. 3 is a cross-sectional view taken along line A-A' of FIG. 2.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

A solar cell in a stack structure having no step (hereinafter, referred to as a "solar cell"), which is the present invention, includes a solar cell 10, an electrode 20 formed in the solar cell 10, a substrate 30, and an electrode line 40 coated on the substrate 30.

FIG. 1A illustrates the solar cell 10 and the electrode 20, and FIG. 1B illustrates the substrate 30 and the electrode line 40. The electrode 20 is formed on one surface of the solar cell 10. As long as the electrode 20 is capable of outputting power generated by the solar cell to the outside, the electrode 20 may have any kind of shape, and may be formed to protrude from both sides of the solar cell 10 by a predetermined length as an attachment film type electrode having a predetermined width.

The electrode 20 includes a positive electrode 21 and a negative electrode 22 formed to be spaced apart from the positive electrode 21 by a predetermined distance. Accordingly, the electrode line 40 to be described below includes a positive line 41 that is in contact with the positive electrode 21, and a negative line 42 that is in contact with the negative electrode 22.

The substrate 30 may use a glass material having high transmittance, but is not limited thereto. Particularly, the substrate 30 may be roof glass used for a sun roof of a vehicle.

The solar cell 10 is stacked on a center portion 31 of the substrate 30, and a ceramic line 70 and the electrode line 40 are coated on an edge portion 32 of the substrate 30.

Since the center portion 31 of the substrate 30 is transparent, light incident from the outside may reach the solar cell 10. The edge portion 32 of the substrate 30 is coated with the ceramic line 70 and is opaque accordingly, so that even though the electrode line 40 is coated or a frame of the solar cell is attached, the electrode line 40 or the frame may be invisible.

However, the ceramic line 70 may not be coated on the edge portion 32 of the substrate 30, and in this case, the electrode line 40 may be directly coated on the edge portion 32 of the substrate 30.

The solar cell 10 is stacked on the center portion 31 of the substrate 30 with the electrode 20 interposed therebetween. In this case, the protruding portion of the electrode 20 is in contact with one end of the electrode line 40. The other end of the electrode line 40 is connected with a wire member. Accordingly, the power generated by the solar cell 10 may flow to the wire member through the electrode 20 and the electrode line 40 and may be stored in a battery, or may be used by another power device.

FIG. 2 is an enlarged image illustrating a connection structure of the electrode 20 and the electrode line 40 when the solar cell 10 and the substrate 30 are stacked as described above. FIG. 3 is a cross-sectional view of the solar cell taken along line A-A' of FIG. 2.

Referring to FIGS. 2 and 3, it can be seen that the electrode 20 is formed on the solar cell 10 and protrudes from a lateral surface of the solar cell 10 by a predetermined length, and one end of the electrode 20 is in contact with one end of the electrode line 40 coated on the substrate 30.

In a solar cell in the related art, an electrode and a wire member, such as a copper conductive wire, are directly connected, so that the wire member is inserted into a stack structure of the solar cell, and thus a step or a gap is inevitably generated in the stack structure. Accordingly, there is a problem in that durability of the solar cell may be degraded, or the stack structure is separated.

Various embodiments of the present invention solve the aforementioned problems by coating the electrode line 40 on the substrate 30 and making the electrode line 40 be in contact with the electrode 20. One end of the electrode line 40 is inserted into the stack structure of the solar cell and is in contact with the electrode 20, and the other end of the electrode line 40 is connected with the wire member from the outside of the stack structure. The electrode line 40 has a plane shape, so that even though one end of the electrode line 40 is inserted into the stack structure, a step or a gap is not generated, unlike the wire member.

Since the electrode line 40 needs to transfer power flowing through the electrode 20 to the wire member as described above, the electrode line 40 may be formed by coating a conductive material on the substrate 30.

Particularly, the electrode line 40 may be a conductive paste. The conductive paste may be a metal paste including any one or more of a silver (Ag) paste, an aluminum (Al) paste, and a copper (Cu) paste.

As the electrode line 40, a mixture of the metal paste and polyurethane or silicon oxide may be used for improving adhesive force with the ceramic line (or the substrate).

The solar cell according to various embodiments of the present invention may further include a finishing member 60 bonded with an area covering the solar cell 10 and a part of the electrode line 40.

The finishing member 60 is configured to protect the solar cell 10, the electrode 20, and the like constituting the stack structure of the solar cell. The other end of the electrode line 40 needs to be connected with the wire member, so that the finishing member 60 may not cover the entire electrode line 40.

Any material may be used as a finishing member as long as the material performs the aforementioned functions as the finishing member 60 does, and preferably a polyethylene terephthalate (PET) film may be used.

The substrate 30, the solar cell 10, and the finishing member 60 may be stacked with an adhesive member 50 interposed therebetween. The adhesive member 50 may provide attachment force between the respective elements so as to maintain the stack structure of the solar cell.

Any material may be used as an adhesive member as long as the material performs the aforementioned function as the adhesive member 50 does, but in some embodiments polyvinyl butyral, which is transparent and thus does not influence performance of the solar cell, may be used.

A total thickness of the solar cell may be 10 mm or less. A thickness of the solar cell 10 may be 0.3 to 0.7 mm, preferably, 0.5 mm. A thickness of the electrode 20 may be 0.1 to 0.2 mm, preferably, 0.1 mm. A thickness of the substrate 30 may be 3 to 5 mm, preferably, 4 mm. A thickness of the finishing member 60 may be 0.1 to 0.3 mm, preferably, 0.2 mm. A thickness of the adhesive member 50 may be 0.6 to 0.9 mm, preferably, 0.75 mm. A thickness of the electrode line 40 may be 0.1 to 0.3 mm, preferably, 0.2 mm.

Figure 4:
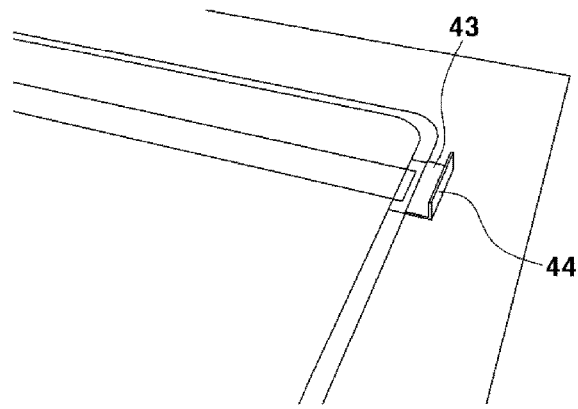
FIG. 4 is an image illustrating an electrode line according to various embodiments of the present invention.

FIG. 4 is an image illustrating various embodiments of the electrode line 40.

The electrode line 40 may include a coating member 43, which is formed on the substrate and is in contact with the electrode, and a connection member 44, which protrudes from the coating member 43 at a predetermined angle and is connected with the wire member.

The coating member 43 has a plane shape and is coated on the substrate, and may be difficult to be connected with the wire member. Accordingly, it is possible to secure a space for a connection between the electrode line and the wire member by forming the connection member 44 to protrude from the coating member 43.

The connection between the connection member 44 and the wire member may be performed by any kind of method, but may be performed by a method of forming a connection hole to pass through the connection member 44 and connecting the wire member through the connection hole, or a method of seating the wire member on a portion, in which the coating member 43 is in contact with the connection member 44, and then surrounding the wire member with the connection member 44 and connecting the wire member and the connection member 44.

Figure 5A:
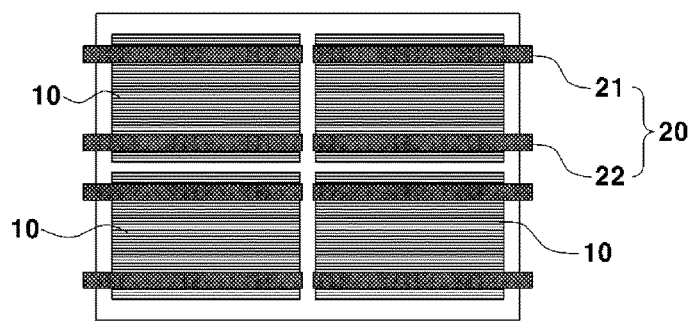
FIG. 5A and FIG. 5B are images illustrating a configuration of a solar cell including a plurality of solar cells according to various embodiments of the present invention.
Figure 5B:
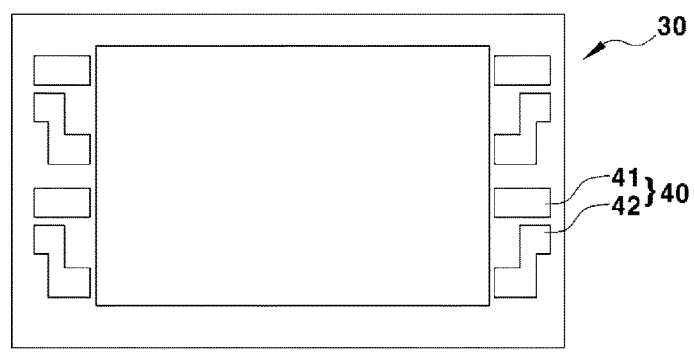

FIG. 5 is an image illustrating another form of the solar cell according to various embodiments of the present invention.

Particularly, FIG. 5 illustrates the solar cell in a case where a plurality of the solar cells 10 is stacked on the substrate 30. In this case, a plurality of electrode lines 40 may be coated on the substrate 30 so as to be in contact with the electrodes 20 formed in the plurality of solar cells 10.

In a case where the wire member is directly connected to the electrode like the related art, when the number of solar cells is increased or an arrangement of the solar cells is changed, an insertion path of the wire member, a position between the wire members, and the like need to be changed together.

However, according to various embodiments of the present invention, it is necessary to determine only a coating position of the electrode line 40 again, so that it is easy to change a design of the electrode line 40.

The solar cell according to various embodiments of the present invention may be manufactured by the operations below.

A ceramic line is coated on an edge portion of a substrate by a screen-print method, and a coating member (electrode line) is formed on the ceramic line by the same method. In this case, the coating member is formed at a position which may be in contact with an electrode of a solar cell. A film-type electrode is attached to the solar cell. An adhesive member is attached onto one surface of the solar cell, in which the electrode is formed.

The solar cell is bonded to a center portion of the substrate with the adhesive member. In this case, the electrode may be in contact with the coating member.

The adhesive member is attached onto the solar cell, and then a finishing member is bonded thereto.

A connection member is formed to protrude from the coating member at a predetermined angle. In this case, the connection member may be attached to the coating member by using lead-free soldering or a conductive glue.

As described above, in the solar cell according to various embodiments of the present invention, the electrode and the wire member are connected through the electrode line coated on the substrate, so that a step or a gap is not generated in the stack structure.

Accordingly, when the solar cell is mounted in a vehicle and the like, problems caused by a step or a gap, such as a short-circuit of the wire member and a separation of the stack structure, do not occur.

It is easy to change a design of the electrode line, so that it is possible to flexibly cope with a case where the number of solar cells is increased or an arrangement of the solar cells is changed.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A solar cell apparatus in a stack structure, the solar cell comprising:
    a solar cell;
    a substrate;
    an electrode formed on a first surface of the solar cell in an attachment film and protruding from first and second sides of the solar cell; and
    an electrode line including a conductive paste coated on the substrate,
    wherein the solar cell is stacked on a center portion of the substrate with the electrode interposed between the solar cell and the substrate,
    wherein the electrode is in contact with an electrode line coated on an edge portion of the substrate, wherein a first protruding end of the electrode is contact with a first end of the electrode line, the first end of the electrode line being inserted in the stack structure of the solar cell apparatus, wherein a second end of the electrode line is connected with a wire member, wherein the electrode includes a positive electrode and a negative electrode spaced apart from the positive electrode by a predetermined distance, and wherein the electrode line includes a positive electrode line that is in contact with a first end of the positive electrode and a negative electrode line that is in contact with a first end of the negative electrode, respectively.

2. The solar cell apparatus of claim 1, wherein the conductive paste comprises a metal paste including a silver (Ag) paste, an aluminum (Al) paste, and a copper (Cu) paste, or a mixture of the metal paste and polyurethane or silicon oxide.

3. The solar cell apparatus of claim 1, further comprising a finishing member stacked on the solar cell with an area covering the solar cell and a part of the electrode line.

4. The solar cell apparatus of claim 1, further comprising an adhesive member interposed between the solar cell and the substrate.

5. The solar cell apparatus of claim 1, further comprising a ceramic line coated on the edge portion of the substrate, wherein the electrode line is coated on the ceramic line.

6. The solar cell apparatus of claim 1, wherein the electrode line includes a coating member, which is formed on the substrate and is in contact with the electrode, and a connection member, which protrudes from the coating member at a predetermined angle and is connected with the wire member.

7. The solar cell apparatus of claim 1, wherein a plurality of solar cells is stacked on the substrate, and wherein a plurality of electrode lines including the positive electrode line and the negative electrode line, the plurality of electrode lines which is in contact with electrodes including the positive electrode and the negative electrode formed in the plurality of the solar cells, is coated on the substrate.

* * * * *